(12) United States Patent
Shin et al.

(10) Patent No.: US 7,338,689 B2
(45) Date of Patent: Mar. 4, 2008

(54) COMPOSITION FOR FORMING LOW DIELECTRIC THIN FILM INCLUDING SILOXANE MONOMER OR SILOXANE POLYMER HAVING ONLY ONE TYPE OF STEREOISOMER AND METHOD OF PRODUCING LOW DIELECTRIC THIN FILM USING SAME

(75) Inventors: Hyeon Jin Shin, Gyeonggi-do (KR); Hyun Dam Jeong, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 260 days.

(21) Appl. No.: 11/218,753

(22) Filed: Sep. 6, 2005

(65) Prior Publication Data

US 2006/0175683 A1    Aug. 10, 2006

(30) Foreign Application Priority Data

Feb. 7, 2005  (KR) .................. 10-2005-0011399

(51) Int. Cl.
*B05D 3/02* (2006.01)
(52) U.S. Cl. .................. 427/387; 427/96.1; 427/98.4; 427/373; 428/447; 524/858; 524/860; 528/35; 528/37
(58) Field of Classification Search .................. None
See application file for complete search history.

(56) References Cited

U.S. PATENT DOCUMENTS

| | | | |
|---|---|---|---|
| 3,615,272 A | 10/1971 | Collins et al. | |
| 4,399,266 A | 8/1983 | Matsumura et al. | |
| 4,999,397 A | 3/1991 | Weiss et al. | |
| 5,965,679 A | 10/1999 | Godschalx et al. | |
| 6,093,636 A | 7/2000 | Carter et al. | |
| 6,107,357 A | 8/2000 | Hawker et al. | |
| 6,204,202 B1 | 3/2001 | Leung et al. | |
| 6,231,989 B1 | 5/2001 | Chung et al. | |
| 6,406,794 B1 | 6/2002 | Shiota et al. | |
| 6,413,882 B1 | 7/2002 | Leung et al. | |
| 6,423,770 B1 | 7/2002 | Katz | |
| 2005/0287818 A1* | 12/2005 | Hata et al. | 438/778 |

OTHER PUBLICATIONS

O. Shchegolokhina et al., "Synthesis and Properties of Stereoregular Cyclic Polysilanols: cis-[PhSi(O)OH]$_{4r}$ cis-[PhSi(O)OH]$_{6r}$ and Tris-cis-tris-trans-[PhSi(O)OH]$_{12}$", Inorganic Chemistry, 2002, vol. 41, No. 25, pp. 6892-6904.

T. Kudo et al., "Exploring the Mechanism for the Synthesis of Silsesquioxanes. 3. The Effect of Substituents and Water." J.Phys Chem. A 2002, vol. 106, No. 46, p. 11347-11353.

* cited by examiner

*Primary Examiner*—Marc S. Zimmer
(74) *Attorney, Agent, or Firm*—Buchanan Ingersoll & Rooney PC

(57) ABSTRACT

Disclosed herein is a composition for forming a low dielectric thin film, which includes silane monomers having only any one of stereoisomer, or a siloxane polymer produced by polymerizing the monomers, and a method of producing the low dielectric thin film using the same. When using the composition, mechanical properties are excellent because tacticity of a matrix is improved, and formation of pores is increased due to a molecular free volume, thus it is possible to produce a low dielectric thin film having low dielectricity.

27 Claims, 3 Drawing Sheets all-cis T4Q4    cis,trans,cis,trans T4Q4    alt-trans T4Q4    cis,cis,cis,trans T4Q4

◎ = CH₃    ● = SiOH

US 7,338,689 B2

COMPOSITION FOR FORMING LOW DIELECTRIC THIN FILM INCLUDING SILOXANE MONOMER OR SILOXANE POLYMER HAVING ONLY ONE TYPE OF STEREOISOMER AND METHOD OF PRODUCING LOW DIELECTRIC THIN FILM USING SAME

This non-provisional application claims priority under 35 U.S.C. § 119(a) on Korean Patent Application No. 2005-11399 filed on Feb. 7, 2005, which is herein incorporated by reference.

BACKGROUND OF THE INVENTION

1. Field of the Invention

The embodiments of the present invention relate to a composition for forming a low dielectric thin film and a method of producing the low dielectric thin film using the same. More particularly, the embodiments of the present invention pertain to a composition for forming a low dielectric thin film, which includes a siloxane monomer or a siloxane polymer having only a single type of stereoisomer, and a method of producing a low dielectric thin film using the same. Since the siloxane monomer includes only any one of two or more types of stereoisomer, tacticity of a matrix is improved depending on the structure of the low dielectric thin film, thus mechanical properties are improved and more pores are formed, resulting in reduced dielectricity.

2. Description of the Related Art

In accordance with the development of a semiconductor fabrication technology, reduction in size of a semiconductor device and a significant increase in the degree of integration of devices have continued. In a semiconductor field, the degree of integration of the device means the number of devices mounted on one semiconductor chip, and indicates how many logic devices constitute one chip. That is to say, performance increases as the degree of integration increases. However, performance of the device may depend on metal wires when the degree of integration of the device increases, and it is necessary to reduce a charge capacity of an interlayer insulating film so as to reduce resistance and capacitance of the wire. To achieve this, effort has been made to use material having low dielectricity as an interlayer insulating film. For example, U.S. Pat. Nos. 3,615,272, 4,399,266, and 4,999,397 disclose polysilsesquioxane, having a dielectricity of 2.5-3.1, which is produced through a spin on deposition (SOD) process, instead of an oxide film ($SiO_2$) having a dielectricity of 4.00, which is produced through a conventional chemical vapor deposition (CVD) process. Furthermore, U.S. Pat. No. 5,965,679 discloses polyphenylene which is an organic polymer having a dielectricity of 2.65-2.70. However, the above-mentioned materials have a dielectricity unsuitable to produce a high-speed device requiring a very low dielectricity of 2.50 or less. Accordingly, many attempts have been made to add air, having a dielectricity of 1.0, into a substance for forming a film, which is made of organic or inorganic material.

U.S. Pat. No. 6,231,989 discloses a method of forming a porous thin film. In the method, hydrogen silsesquioxane is mixed with a solvent which has a high boiling point and is capable of forming pores, and then treated with ammonia. Furthermore, U.S. Pat. Nos. 6,093,636 and 6,107,357 disclose a method of forming an insulating film having a very low dielectricity. In the method, a predetermined amount of porogen, which is capable of being decomposed during step of forming a thin film, is mixed with a film forming substance made of organic or inorganic material to form a thin film, and the porogen is then decomposed at high temperatures to form pores. Additionally, recently, U.S. Pat. Nos. 6,204,202, 6,413,882, 6,423,770, and 6,406,794 disclose a method of producing a porous low dielectric thin film, in which a polyalkyleneoxide-based amphiphilic surfactant is used as a porogen. However, in this method, since pores are partially or totally connected to each other, physical properties of an insulating film are reduced, and diffusion of chemical substances which are used for a low dielectric interlayer insulating film in a semiconductor process and metal atoms occurs. Therefore, it is important to reduce sizes of the pores to be formed and interconnectivity of the pores.

As well, if many pores are formed in the film during formation of the low dielectric interlayer insulating film, mechanical properties, such as hardness and modulus, are reduced, thus it is difficult to conduct subsequent processes, such as chemical mechanical polishing (CMP).

Meanwhile, another conventional technology (Dow Coming, *Inorg. Chem.* 2002, 41, 6892-6904) discloses a method of producing a cyclic polysilane having tacticity using a metal complex. However, since a process of forming the metal complex is necessary, the process is complicated, and production of an insulating film using it is not mentioned in this technology. Furthermore, a related document (*J. Phys. Chem. A* 2002, 106, 11347-11353) discloses research results of a mechanism for effects of cis- and trans-type stereoisomers based on theoretical calculations, but does not mention test results after separation of them and production of insulating films using them.

OBJECTS AND SUMMARY

Accordingly, the embodiments of the present invention have been made keeping in mind the above problems occurring in the related art, and an object of the embodiments of the present invention is to provide a composition for forming a low dielectric thin film, which includes siloxane monomers having only a single type of stereoisomer, so that mechanical properties of the low dielectric thin film are improved and its dielectricity is reduced using the siloxane monomers having only any one of two or more types of stereoisomer.

Another object of the embodiments of the present invention is to provide a composition for forming a low dielectric thin film, which includes a siloxane polymer produced by polymerizing siloxane monomers having only any one of two or more types of stereoisomer.

A further object of the embodiments of the present invention is to provide a method of producing a low dielectric thin film, which employs siloxane monomers having only any one of two or more types of stereoisomer or a siloxane polymer produced by polymerizing the siloxane monomers.

In order to accomplish the above objects, an aspect of the present invention provides a composition for forming a low dielectric thin film, which comprises siloxane monomers including only any one of two or more types of stereoisomer, a porogen, and a solvent including acid or base and water.

Another aspect of the present invention provides a composition for forming a low dielectric thin film. The composition comprises a siloxane polymer which is produced by polymerizing siloxane monomers including only any one of two or more types of stereoisomer, a porogen, and a solvent.

Another aspect of the present invention provides a method of producing a low dielectric thin film. The method comprises applying the composition according to the present invention, which has siloxane monomers or a siloxane polymer including only any one of two or more types of stereoisomer, on a substrate and hardening the resulting composition.

BRIEF DESCRIPTION OF THE DRAWINGS

The above and other objects, features and advantages of the embodiments of the present invention will be more clearly understood from the following detailed description taken in conjunction with the accompanying drawings, in which.

DETAILED DESCRIPTION OF THE PREFERRED EMBODIMENTS

Figure 1:
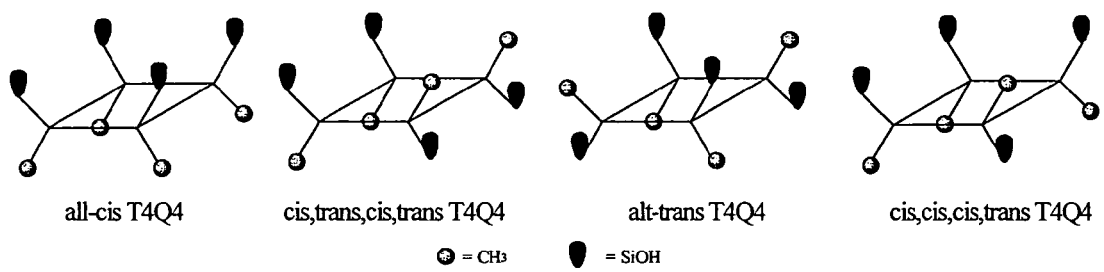
FIG. 1 illustrates four types of stereoisomer of a siloxane monomer which can be used in the embodiments of the present invention.

The present inventors have conducted extensive studies into siloxane monomers as a film forming substance for producing a low dielectric thin film, resulting in the finding that tacticity is reduced when the siloxane monomers include two or more types of stereoisomer. As presently understood, the reduction in tacticity results when such monomers are polymerized into a polymer that then has a microscopic structure in which the isomers are scattered. In connection with this, since it is difficult to separate the isomers from each other after the polymerization is achieved, the siloxane monomers are separated depending on the type of stereoisomer before the polymerization is conducted to form the film forming substance, so that the siloxane monomers having only any one of two or more types of stereoisomer are selected. Thereby, the embodiments of the present invention include a composition for forming a low dielectric thin film, which comprises the siloxane monomers having only any one of two or more types of stereoisomer, a porogen, a solvent, an acid or base, and water, and a method of producing a low dielectric thin film using the same, which comprises applying the composition on a substrate and hardening the resulting substrate.

Hereinafter, a detailed description will be given of the embodiments of the present invention, referring to the accompanying drawings.

A preferred composition for forming a low dielectric thin film according to an embodiment of the present invention comprises 1-70 wt % siloxane monomers including only any one of two or more types of stereoisomer, 0-50 wt % porogen, and the balance primarily of a solvent, an acid or base, and water. A preferred molar ratio of the total monomer mixture to a catalyst (acid or base) is $1:1 \times 10^{-5}$ to 1:10 and a preferred molar ratio of the mixture to water is 1:1 to 1:100. If the composition is applied on a substrate and hardened by heating, monomers having predetermined tacticity are polymerized to produce a polymer, which has a microscopic structure having predetermined tacticity. Accordingly, it is possible to produce a low dielectric thin film which has excellent mechanical properties, such as hardness and modulus, and also has a very low dielectricity because many pores are formed due to a molecular free volume. The low dielectric thin film thus produced is useful as a low dielectric semiconductor interlayer insulating film and can be used for various applications, such as display material, chemical sensors, biocatalysts, insulators, or packaging material.

In the embodiments of the present invention, a siloxane monomer which is capable of being three-dimensionally controlled, while not limited to the following, may be a monomer selected from the group consisting of a multi-reactive cyclic siloxane monomer of the following Formula 1, a Si monomer having organic legs expressed by the following Formula 2 or 3, and a linear alkoxy silane monomer expressed by the following Formula 4 or 5.

Formula 1

In the above Formula, $R_1$ is a hydrogen atom, $C_1$ to $C_3$ alkyl group, or $C_6$ to $C_{15}$ aryl group; $R_2$ is a hydrogen atom, $C_1$ to $C_{10}$ alkyl group, or $SiX_1X_2X_3$ (herein, $X_1$, $X_2$, and $X_3$ are independently a hydrogen atom, $C_1$ to $C_3$ alkyl group, $C_1$ to $C_{10}$ alkoxy group, or a halogen atom, wherein at least one of functional groups, $R_1$ and $R_2$, is a group capable of being hydrolyzed; and m is an integer from 3 to 8.

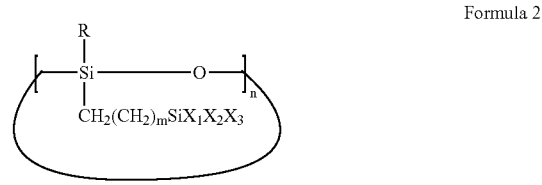

Formula 2

In the above Formula, R is a hydrogen atom, $C_1$ to $C_3$ alkyl group, $C_3$ to $C_{10}$ cycloalkyl group, or $C_6$ to $C_{15}$ aryl group, $X_1$, $X_2$, and $X_3$ are independently $C_1$ to $C_3$ alkyl group, $C_1$ to $C_{10}$ alkoxy group, or a halogen group, n is an integer from 3 to 8, and m is an integer from 1 to 10.

$$X_3X_2X_1Si\text{-}M\text{-}SiX_1X_2X_3 \quad \text{Formula 3}$$

In the above Formula, $X_1$, $X_2$, and $X_3$ are independently a hydrogen atom, $C_1$ to $C_3$ alkyl group, $C_1$ to $C_{10}$ alkoxy group, or a halogen atom, wherein at least one of $X_1$, $X_2$, and $X_3$ is a functional group capable of being hydrolyzed; and M is a single bond, $C_1$ to $C_{10}$ alkylene group, or an arylene group having 6 to 15 carbon atoms.

$$(R_1)_n Si(OR_2)_{4-n} \quad \text{Formula 4}$$

In the above Formula, $R_1$ is a hydrogen atom, $C_1$ to $C_3$ alkyl group, a halogen group, or $C_6$ to $C_{15}$ aryl group, $R_2$ is a hydrogen atom, $C_1$ to $C_3$ alkyl group, or $C_6$ to C15 aryl group, wherein at least one of $R_1$ and $OR_2$ is a functional group capable of being hydrolyzed; and n is an integer from 0 to 3.

Formula 5

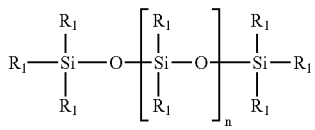

In the above Formula, $R_1$ is a hydrogen atom, $C_1$ to $C_3$ alkyl group, $C_1$ to $C_{10}$ alkoxy group, or a hydroxy or halogen atom, wherein at least one of them is a functional group capable of being hydrolyzed; and n is an integer from 0 to 30.

Preferably, examples of the cyclic siloxane monomer of Formula 1 according to the embodiments of the present invention include a compound (TS-(OH); referred to as 'tetrol') of the following Formula 6 which corresponds to Formula 1 where $R_1$ is methyl, $R_2$ is hydrogen, and m is 4; a compound (TS-T4(OMe)) of Formula 7 which corresponds to Formula 1 where $R_1$ and $R_2$ are methyl and m is 4; a compound (TS-T4Q4) of the following Formula 8 which corresponds to Formula 1 where $R_1$ is methyl, $R_2$ is $Si(OCH_3)_3$, and m is 4; a compound (TS-T4T4) of the following Formula 9 which corresponds to Formula 1 where $R_1$ is methyl, $R_2$ is $SiCH_3(OCH_3)_2$, and m is 4; a compound (TS-T4D4) of the following Formula 10 which corresponds to Formula 1 where $R_1$ is methyl, $R_2$ is $Si(CH_3)_2(OCH_3)$, and m is 4; or a compound (TS-T4M4) of the following Formula 11 which corresponds to Formula 1 where $R_1$ is methyl, $R_2$ is $Si(CH_3)_3$, and m is 4.

Formula 6

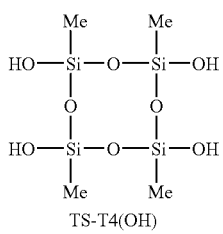
TS-T4(OH)

Formula 7

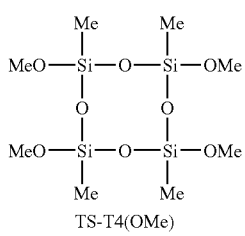
TS-T4(OMe)

Formula 8

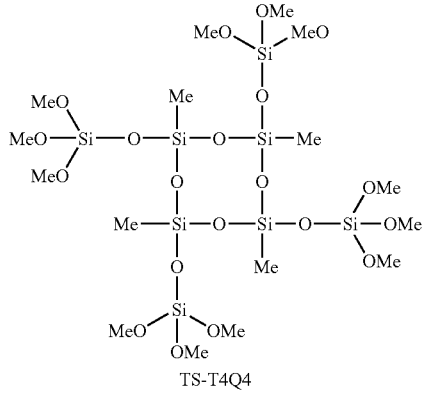
TS-T4Q4

Formula 9

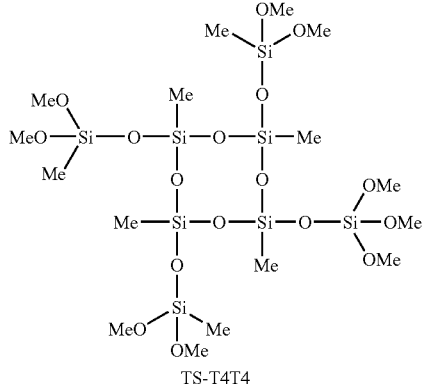
TS-T4T4

Formula 10

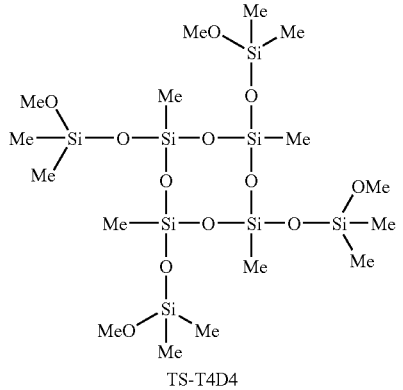
TS-T4D4

Formula 11

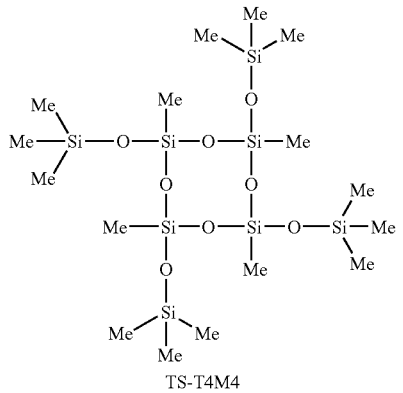
TS-T4M4

As shown in FIG. 1, a siloxane monomer includes two to four types of stereoisomer. Of the four types of stereoisomer shown in FIG. 1, the cis, trans, cis, trans T4Q4 corresponds to references in the present application of a trans-type stereoisomer. As shown in the following Reaction Equation 1, two or more types of stereoisomer are contained in a starting substance, and a structural change does not occur during a reaction process, thus the final siloxane monomer includes the stereoisomers.

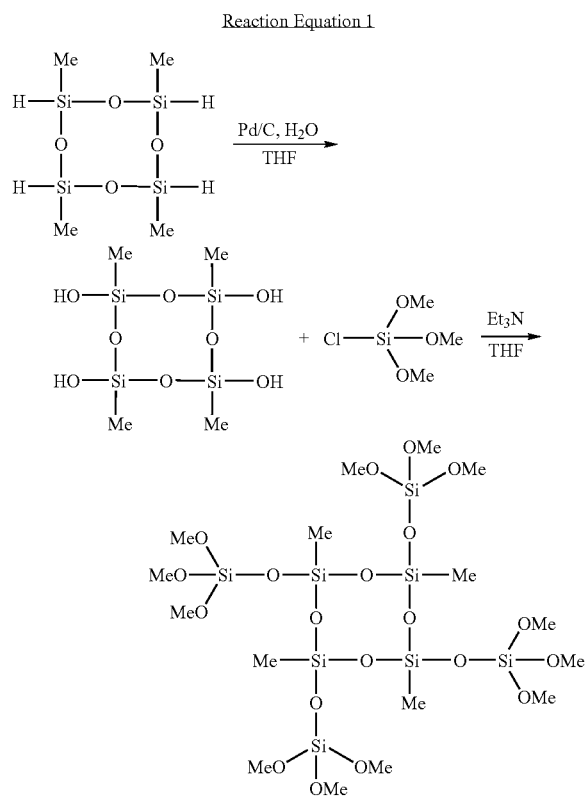

The siloxane monomers are polymerized to form the polymer having a microscopic structure in which the isomers are scattered, thus tacticity is reduced. In is order to form an insulating film using a siloxane monomer having only one type of stereoisomer siloxane monomers would have to be separated from each other depending on the type of stereoisomer. However, since it is very difficult to separate the stereoisomers scattered in the siloxane monomer in accordance with their types they have conventionally been polymerized without separating them to produce a film forming substance with two or more types of stereoisomer. Some embodiments of the present invention are characterized in that siloxane monomers are re-crystallized to separate cis-type stereoisomers from trans-type stereoisomers, and the siloxane monomers are used depending on the type of stereoisomer to produce the film forming substance. The re-crystallization is conducted in a reaction solution in the course of producing tetrol from a siloxane salt in the following reaction equation. Cis-type stereoisomers are produced through the re-crystallization using ether at room temperature, and trans-type stereoisomers are produced through the re-crystallization using a mixed solvent including ether and toluene in a mixing ratio of 1:3 at a low temperature of −4° C.

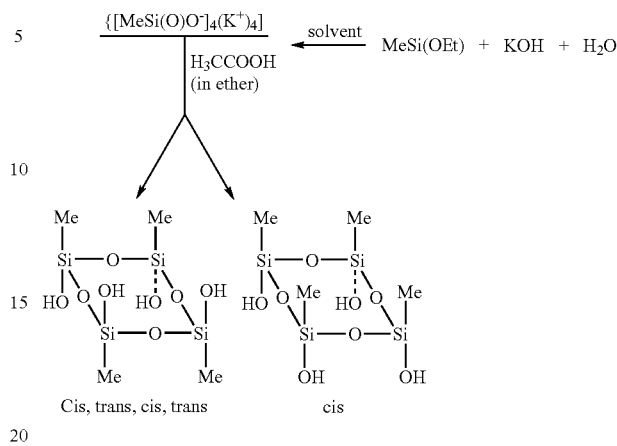

The porogen which is capable of being used in the embodiments of the present invention includes all known porogens used to form a porous insulating film. In detail, illustrative but non-limiting examples of the porogen include polycaprolactone, α-cyclodextrin, β-cyclodextrin, and γ-cyclodextrin.

A surfactant may be used as the porogen in the embodiments of the present invention including an anionic surfactant, a cationic surfactant, and a nonionic surfactant, or a block copolymer. Illustrative, but non-limiting, examples of an anionic surfactant include sulfate, sulfonate, phosphate, or carboxylic acid. Illustrative, but non-limiting, examples of the cationic surfactant include an alkyl ammonium salt, a gemini surfactant, a cetyl ethyl piperidinium salt, or a dialkyl dimethyl ammonium salt. Illustrative, but non-limiting, examples of the nonionic surfactant are selected from the group consisting of a BRij-based surfactant, primary amine, poly(oxyethylene) oxide, octaethylene glycol monodecyl ether, octaethylene glycol monohexadecyl ether, octylphenoxy polyethoxy(9-10) ethanol (Triton X-100), and a block copolymer. In the composition of the embodiments of the present invention, it is preferable that the amount of porogen be 0-50 wt % based on the total weight of the composition. In other words, it is possible to produce the low dielectric thin film using the composition not containing the porogen.

Preferred examples of the surfactant include a polyethylene oxide-polypropylene oxide block copolymer expressed by the following Formula 12, a polyethylene oxide-polypropylene oxide-polyethylene oxide triblock copolymer expressed by the following Formula 13, a cyclodextrin derivative expressed by the following Formula 14, cetyl trimethyl ammonium bromide (CTAB), octylphenoxy polyethoxy(9-10) ethanol (triton X-100), or an ethylene diamine alkoxylate block copolymer.

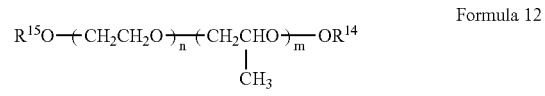

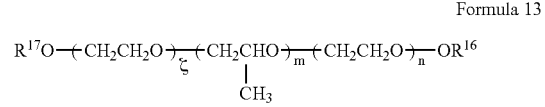

In the above Formulae, $R^{14}$, $R^{15}$, $R^{16}$, and $R^{17}$ are independently a hydrogen atom, $C_2$ to $C_{30}$ acyl group, $C_1$ to $C_{20}$ alkyl group, or a silicon (Si) compound expressed by $Sir_1r_2r_3$, wherein $r_1$, $r_2$, and $r_3$ are independently a hydrogen atom, $C_1$ to $C_6$ alkyl group, $C_1$ to $C_6$ alkoxy group, or $C_6$ to $C_{20}$ aryl group, $\zeta$ is an integer from 2 to 200, m is an integer from 20 to 80, and n is an integer from 2 to 200.

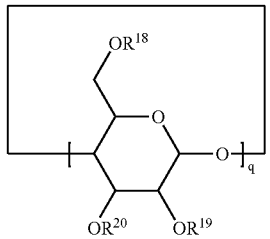

Formula 14

In the above Formula, $R^{18}$, $R^{19}$, and R20 are independently a hydrogen atom, $C_2$ to $C_{30}$ acyl group, $C_1$ to $C_{20}$ alkyl group, or a silicon (Si) compound expressed by $Sir_1r_2r_3$, wherein $r_1$, $r_2$, and $r_3$ are independently a hydrogen atom, $C_1$ to $C_6$ alkyl group, $C_1$ to $C_6$ alkoxy group, or $C_6$ to $C_{20}$ aryl group, and q is an integer from 5 to 8.

Meanwhile, illustrative, but non-limiting, examples of an acid catalyst capable of being used in the embodiments of the present invention include any known acid catalyst as long as it may be used to produce the siloxane polymer. Preferably, the acid catalyst is exemplified by hydrochloric acid, nitric acid, benzene sulfonic acid, oxalic acid, or formic acid. In the embodiments of the present invention, the base catalyst may be exemplified by potassium hydroxide, sodium hydroxide, triethylamine, sodium bicarbonate, or pyridine.

The composition for forming the low dielectric thin film according to another aspect of the embodiments of the present invention comprises a siloxane polymer which is produced by polymerizing the siloxane monomers including only any one of two or more types of stereoisomer. The siloxane polymer may be produced by polymerizing the siloxane monomers including only any one type of stereoisomer using an acid or base catalyst.

The composition for forming the low dielectric thin film according to another aspect of the embodiments of the present invention comprises 1-70 wt % siloxane polymer which is produced by polymerizing or copolymerizing siloxane monomers including only any one of two or more types of stereoisomer, 0-50 wt % porogen, and solvent.

Examples of the siloxane polymer capable of being used in the embodiments of the present invention may include a homopolymer which is produced by polymerizing one type of siloxane monomer of the above-mentioned Formulae 1 to 5, or a copolymer which is produced by copolymerizing two or more types of monomers. It is preferable that a weight average molecular weight of the siloxane polymer used in the embodiments of the present invention be 1000 to 100000.

A porogen for use with a siloxane polymer may be identical or similar to the above-mentioned porogen.

Illustrative, but non-limiting, examples of the solvent used in the embodiments of the present invention include an aliphatic hydrocarbon solvent, such as hexane or heptane; an aromatic hydrocarbon solvent, such as anisol, mesitylene, or xylene; a ketone-based solvent, such as methyl isobutyl ketone, 1-methyl-2-pyrrolidone, cyclohexanone, or acetone; an etherbased solvent, such as tetrahydrofuran or isopropyl ether; an acetate-based solvent, such as ethyl acetate, butyl acetate, or propylene glycol methyl ether acetate; an alcohol-based solvent, such as isopropyl alcohol or butyl alcohol; an amide-based solvent, such as dimethyl acetamide or dimethyl formamide; a silicon-based solvent; or a mixture thereof.

The content of solids in the composition according to the embodiments of the present invention is not limited, but it is preferable that the composition comprise 1-70 wt % siloxane polymer as the film forming substance, 0-50 wt % porogen, and the 0-99 wt % solvent based on the total weight of the composition as described above. If the content of siloxane polymer is more than 70 wt %, it is saturated in the solution, thus it is difficult to conduct spin coating in solution form.

Another aspect of the embodiments of the present invention relates to a method of producing a low dielectric thin film using the composition of the embodiments of the present invention. The method of producing the low dielectric thin film comprises preparing a coating solution, which includes 1-70 wt % siloxane monomers having only one type of two or more types of stereoisomer, 0-50 wt % porogen, solvent, acid or base, and water, applying it on a substrate, and hardening the resulting solution.

A method of producing a low dielectric thin film according to another aspect of the embodiments of the present invention comprises preparing a coating solution, which includes 1-70 wt % siloxane polymer produced by polymerizing siloxane monomers having only one type of two or more types of stereoisomer, 0-50 wt % porogen, and solvent, applying it on a substrate, and hardening the resulting solution.

While the substrate is not limited to, it is preferable that it is impervious the embodiments of the present invention. The substrate may be selected from substrates capable of enduring heat hardening conditions, for example, a glass substrate, a silicon wafer, or a plastic substrate, depending on the purposes.

Illustrative, but non-limiting, examples of processes for applying the composition, capable of being used in the embodiments of the present invention, include spin coating, dip coating, spray coating, flow coating, and screen printing. A preferable process is spin coating in view of convenience and uniformity. In the course of conducting the spin coating, it is preferable to control a spin rate within a range of 800-5000 rpm. After the application is finished, a process of vaporizing the solvent to dry the film may be carried out, if necessary. The film is exposed to the environment, a vacuum is applied in an early step of the hardening process, or heat hardening is conducted at 150-600° C., preferably 200-450° C., for 1-180 min to preferably form an insoluble film having no cracks in order to dry the film. The term "film having no cracks" means a film which does not have cracks capable of being observed with the naked eye when observation is conducted using an optical microscope having 1000× magnification, and the term "insoluble film" means a film which is insoluble in a solvent for precipitating a siloxane-based polymer therein to form the film, or a solvent suitable for conducting the application of a resin.

A better understanding of the embodiments of the present invention may be obtained through the following examples which are set forth to illustrate, but are not to be construed as the limit of the embodiments of the present invention.

SYNTHESIS EXAMPLE

Synthesis of Tetrapotassium Tetramethylcyclotetrasiloxanolate 3.56 g (20 mmol) of methytriethoxysilane were put in a flask, dissolved in 100 ml of ethanol, and reacted with 20 mmol of KOH and 20 mmol of H$_2$O at room temperature for 12 hours. After the reaction was finished, the solvent was removed to produce 3.5 g of potassium methylsiloxanolate {[MeSi(O)O$^-$]$_4$(K$^+$)$_4$}.

Synthesis of Mixed Tetrol 3.7 g of (0.008 mol) tetrapotassium tetramethylcyclotetrasiloxanolate and 5.86 g (0.097 mol) of acetic acid were dissolved in 105 ml of diethyl ether, and reacted at room temperature for 2 hours. After filtering was conducted in order to remove a small amount of precipitate generated during the reaction, the filtered solution was washed with a saturated NaHCO$_3$ (aqueous sodium bicarbonate) solution a few times so as to remove an excessive amount of acetic acid, and concentrated at a low temperature to produce 2.5 g of mixed tetrol.

$^1$H-NMR (300 MHz): δ 5.52(s, 4H, 4[—OH]), 0.067 (s, 12H, 4[—CH$_3$])

Separation of Stereoisomer, Cis-tetrol (A)

5 ml of toluene was added to 20 ml of diethyl ether solution containing the mixed tetrol and then stored at room temperature for one week. The resulting solid was filtered and dried to produce 0.72 g (29%) of cis-tetrol.

$^1$H NMR (400 MHz, acetone-d6, δ, ppm): 5.4329 (s, 4H, 4[—OH]), 0.0459 (s, 12H, 4[—CH$_3$])

Separation of Stereoisomer, Trans-tetrol (B)

20 ml of toluene was added to 20 ml of diethyl ether solution containing the mixed tetrol and then stored at 4° C. in a refrigerator for one day. The resulting solid was filtered and dried to produce 2 g (60%) of trans-tetrol.

$^1$H NMR (400 MHz, acetone-d6, δ, ppm): 5.4135 (s, 4H, 4[—OH]), 0.0459 (s, 12H, 4[—CH$_3$])

Figure 2:
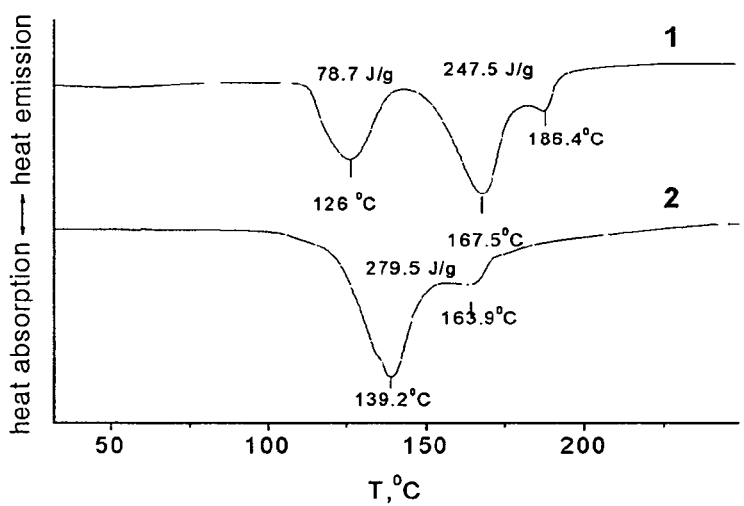
FIG. 2 is a DSC (differential scanning calorimeter) graph of cis-tetrol and trans-tetrol after stereoisomers of the siloxane monomer are separated from each other.
Figure 3:
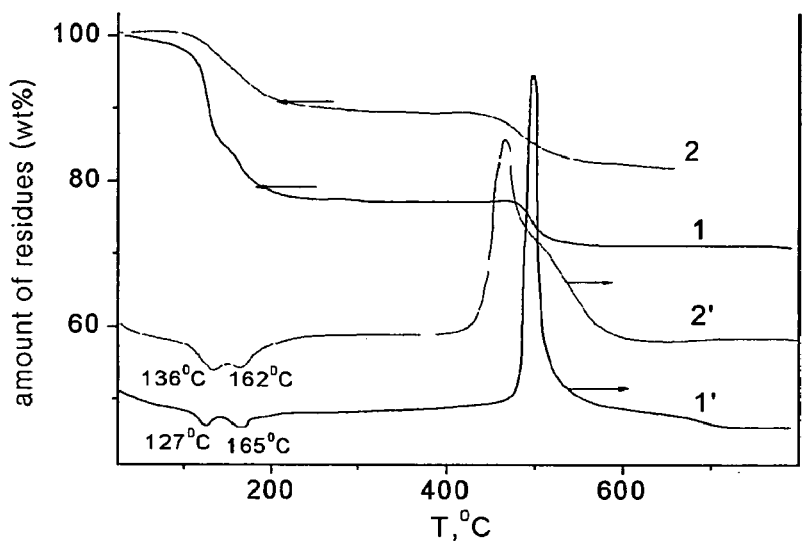
FIG. 3 is a TGA (thermogravimetric analysis) graph of cis-tetrol and trans-tetrol after the stereoisomers of the siloxane monomer are separated from each other.
Figure 4:
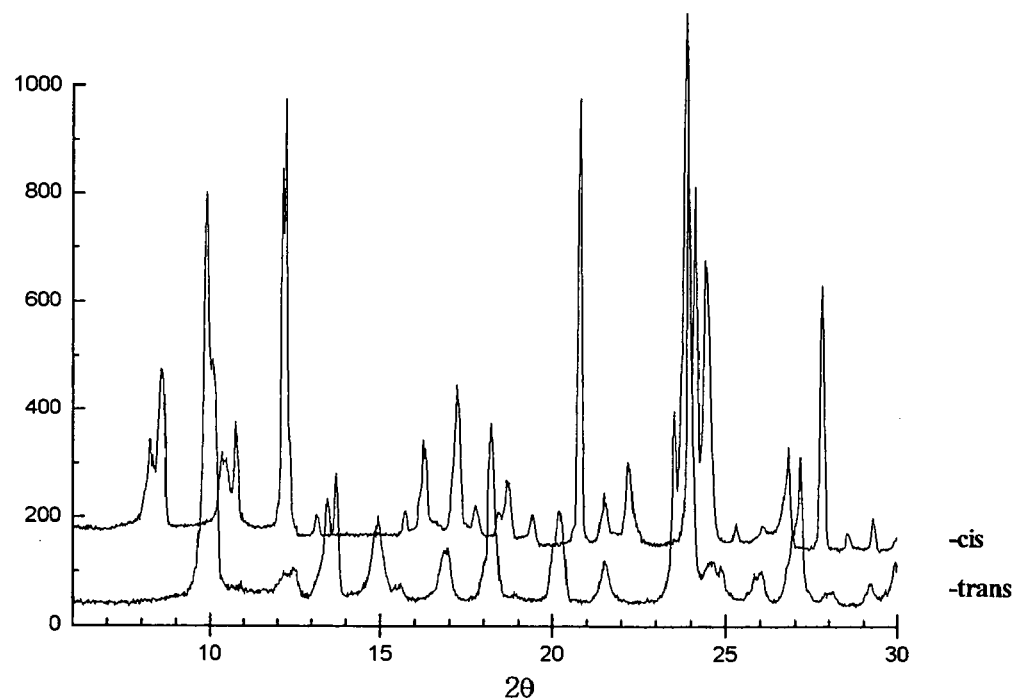
FIG. 4 is a graph illustrating X-ray diffraction analysis results of cis-tetrol and trans-tetrol after the stereoisomers of the siloxane monomer are separated from each other.
Figure 5:
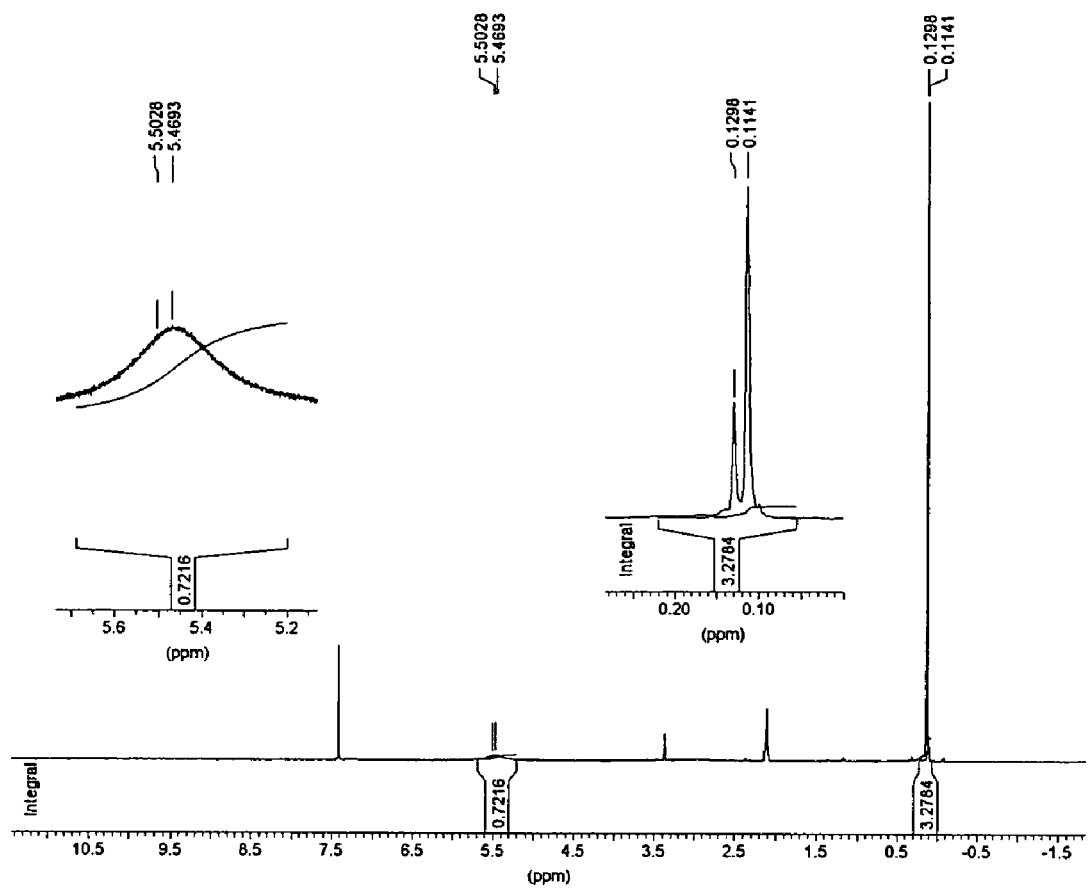
FIG. 5 is a graph illustrating 1H-NMR analysis results of cis-tetrol and trans-tetrol after the stereoisomers of the siloxane monomer are separated from each other.

The cis- and trans-type stereoisomers of tetrol were analyzed using DSC (FIG. 2), TGA (FIG. 3), X-ray diffraction (FIG. 4), and 1H-NMR (FIG. 5), resulting in the confirmation that the cis-type stereoisomer was nicely separated from the trans-type stereoisomer. In FIG. 2, line 1 corresponds to the trans-type stereoisomer and line 2 corresponds to the cis-type stereoisomer. In FIG. 3, lines 1 and 1' correspond to the trans-type stereoisomer and lines 2 and 2' correspond to the cis-type stereoisomer.

Synthesis of Cis-type Multi-reactive Cyclic Siloxane Compound (A-1)

10.4 mmol (4.1 g) of cis-tetrol was diluted with 100 mL of THF (tetrahydrofuran) and 44.5 mmol (3.46 g) of triethyl amine was then added thereto. The temperature of the solution was reduced to 0° C., 44.5 mmol (6.3 g) of chlorotrimethoxysilane were slowly added thereto, and the temperature was slowly increased to room temperature to conduct a reaction for 12 hours. After a reaction solution was filtered using celite, the filtered solution was maintained at reduced pressure of 0.1 torr to remove volatile substances, and then concentrated to produce a colorless liquid monomer of the following Formula 15.

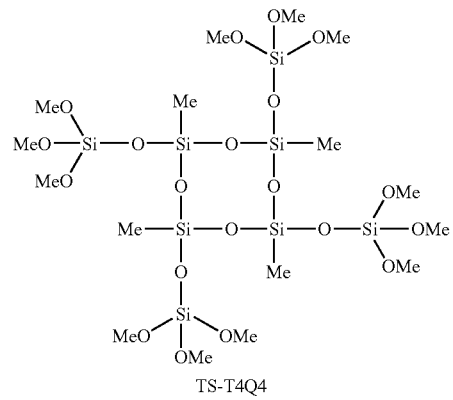

Formula 15

TS-T4Q4

The 1H-NMR (300 MHZ) measurement results of the produced monomer were as follows: δ 0.092(s, 12H, 4×[—CH3]), 3.58 (s, 36H, 4×[—OCH3]3).

Synthesis of Trans-type Multi-reactive Cyclic Siloxane Compound (B-1)

The procedure of synthesis of cis-type mufti-reactive cyclic siloxane compound (A-1) was repeated to produce a trans-compound of Formula 15, hereinafter, referred to as (B-1), except that the trans-tetrol was used instead of the cis-tetrol. The trans-T4Q4 corresponds to the cis, trans, cis, trans stereoisomer.

The 1 H-NMR (300 MHZ) measurement results of the produced monomer were as follows: δ 0.092(s, 12H, 4×[—CH3]), 3.58 (s, 36H, 4×[—OCH3]3).

Synthesis of Mixed Multi-reactive Cyclic Siloxane Compound (C-1)

The procedure of synthesis of the cis-type multi-reactive cyclic siloxane compound (A-1) was repeated to produce a mixed compound of Formula 15, hereinafter, referred to as (C-1), except that the mixed tetrol was used instead of the cis-tetrol.

The 1H-NMR (300 MHZ) measurement results of the produced monomer were as follows: δ 0.092 (s, 12H, 4×[—CH3]), 3.58 (s, 36H, 4×[—OCH3]3).

EXAMPLES A AND B

Production of Insulating Films (A and B)

0.425 g of siloxane monomer (A-1) (insulating film A), which was separated as a cis-type stereoisomer, and 0.425 g of siloxane monomer (B-1) (insulating film B), which was separated as a trans-type stereoisomer, were used as a film forming substance, 0.2 ml of 0.1 M HCl solution was added thereto, and 2 ml of propylene glycol methyl ether acetate were used as a solvent to produce a coating solution containing 18 wt % of solid. A silicon wafer was spin coated with the coating solution at 2000 rpm for 30 sec, preheated on a hot plate in a nitrogen atmosphere at 150° C. for 1 min and at 250° C. for 1 min, and dried to produce a film. The film was heat treated in a vacuum atmosphere at 420° C. (rate of temperature increase: 3° C./min) for 1 hour to produce insulating films A and B. Thicknesses, refractive indices, dielectricities, hardnesses, and elastic moduli of the insulating films thus produced were measured, and the results are described in Table 1.

Evaluation of Physical Properties

In the present example, physical properties of the insulating film were evaluated using the following methods.

1) Measurement of Dielectricity

A silicon thermal oxide was applied on a boron-doped p-type silicon wafer in a thickness of 3000 Å, and titanium, aluminum, and titanium were sequentially deposited thereon in thicknesses of 100 Å, 2000 Å, and 100 Å, respectively, using a metal evaporator to form an insulating film as an object to be measured thereon. Circular titanium and aluminum thin films each having a diameter of 1 mm were deposited on the insulating film in thicknesses of 100 Å and 5000 Å, respectively, using a hard mask which was designed so as to have an electrode diameter of 1 mm, thereby a low dielectric thin film having a MIM (metal-insulator-metal) structure was produced to measure a dielectricity. The capacitance of the thin film was measured at frequencies of is about 10 kHz, 100 kHz, and 1 MHz using a PRECISION LCR METER (HP4284A) equipped with a micromanipulator 6200 probe station, the thickness of the thin film was measured using a prism coupler, and the dielectricity was calculated employing the following Equation.

$$k = C \times d / \epsilon_o \times A$$

wherein, k is a dielectricity, C is a capacitance, $\epsilon_o$ is a dielectric constant of a vacuum ($\epsilon_o = 8.8542 \times 10^{-12}$ Fm$^{-1}$), d is a thickness of an insulating film, and A is a contact sectional area of an electrode.

2) Thickness and Refractive Index

The thickness and the refractive index were measured using an elipsometer and the prism coupler.

3) Hardness and Elastic Modulus

The hardness and the elastic modulus of the thin film were quantitatively analyzed using a nanoindenter II manufactured by MTS Inc. The thin film was indented using the nanoindenter, and the hardness and the elastic modulus of the thin film were measured when an indented depth corresponded to 10% of the thickness of the thin film. The thickness of the thin film was measured using the prism coupler. In examples and comparative examples, the insulating film was indented at six points thereof and the hardness and the elastic modulus were obtained using an average value, so as to assure reliability.

Examples A-1 and B-1

Production of Insulating Films (A-1 and B-1)

The procedure of producing the insulating films A and B was repeated to produce insulating films A-1 and B-1, except that a siloxane monomer (A-1), which was separated as a cis-type stereoisomer, and a siloxane monomer (B-1), which was separated as a trans-type stereoisomer, were each used in an amount of 0.428 g instead of 0.425 g, and 0.183 g of Brij 56 was added as a porogen so as to assure 24 wt % of solids. Thicknesses, refractive indices, dielectricities, hardnesses, and elastic moduli of the insulating films thus produced were measured, and the results are described in Table 1.

COMPARATIVE EXAMPLES C AND C-1

Production of Insulating Films (C and C-1)

The procedure of producing the insulating films A and A-1 was repeated to produce insulating films C and C-1 except that a siloxane monomer (C-1) in which different types of isomers were mixed, was used instead of the monomer which included only one type of various isomers. Thicknesses, refractive indices, dielectricities, and hardnesses of the insulating films thus produced were measured, and the results are described in Table 1.

TABLE 1

| | Physical properties | | | | |
|---|---|---|---|---|---|
| | Refractive index | Dielectricity (k) | Hardness | Modulus | Thickness (Å) |
| Insulating film A | 1.3865 | 2.55 | 1.91 | 12.63 | 5640 |
| Insulating film B | 1.3957 | 2.48 | 2.71 | 17.66 | 5944 |
| Insulating film C | 1.4008 | 3.11 | 2.57 | 16.06 | 5902 |
| Insulating film A-1 | 1.2541 | 2.48 | 0.72 | 4.58 | 8599 |
| Insulating film B-1 | 1.2520 | 2.55 | 0.77 | 5.24 | 9066 |
| Insulating film C-1 | 1.2779 | 2.61 | 0.86 | 5.27 | 9159 |

The values in Table 1 show that insulating films in which the cis-type and trans-type stereoisomers are separated from each other have lower dielectricities than does insulating films C and C-1, in which the stereoisomers are not separated from each other. Particularly, since insulating film B using the trans isomers has lower dielectricity and higher hardness and elastic modulus than the comparative example, it can be seen that the induction of tacticity improves mechanical properties.

A composition for forming a low dielectric thin film, which includes siloxane monomers having only one type of stereoisomer among two or more types of stereoisomer, according to the embodiments of the present invention, is very advantageous in that, during the production of the thin film, tacticity of a matrix is improved to improve mechanical properties, and formation of pores is increased due to a molecular free volume so as to reduce dielectricity.

What is claimed is:

1. A composition for forming a low dielectric thin film, comprising:
    organosilicon monomers, comprising a monomer of a single type of stereoisomer;
    a porogen;
    a solvent,
    an acid or a base; and
    water.

2. The composition as set forth in claim 1, wherein the composition comprises 1-70 wt % siloxane monomers and up to 50 wt % porogen.

3. The composition as set forth in claim 1, wherein each of the siloxane monomers is one type of monomer selected from the group consisting of a multi-reactive cyclic siloxane monomer represented by following Formula 1, a Si monomer represented by following Formulas 2 or 3, and a linear alkoxy silane monomer represented by following Formulas 4 or 5:

Formula 1

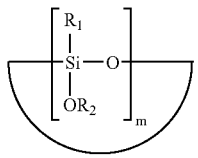

wherein $R_1$ is a hydrogen atom, $C_1$ to $C_3$ alkyl group, or $C_6$ to $C_{15}$ aryl group, $R_2$ is a hydrogen atom, $C_1$ to $C_{10}$ alkyl group, or $SiX_1X_2X_3$, wherein $X_1$, $X_2$, and $X_3$ are independently a hydrogen atom, $C_1$ to $C_3$ alkyl group, $C_1$ to $C_{10}$ alkoxy group, or a halogen atom, wherein at least one of functional groups, $R_1$ and $R_2$, is a hydrolyzable group; and m is an integer from 3 to 8;

Formula 2

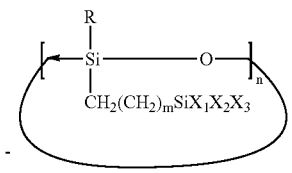

wherein R is a hydrogen atom, $C_1$ to $C_3$ alkyl group, $C_3$ to $C_{10}$ cycloalkyl group, or $C_6$ to $C_{15}$ aryl group, $X_1$, $X_2$, and $X_3$ are independently $C_1$ to $C_3$ alkyl group, $C_1$ to $C_{10}$ alkoxy group, or a halogen group, n is an integer from 3 to 8, and m is an integer from 1 to 10;

$$X_3X_2X_1Si\text{-}M\text{-}SiX_1X_2X_3 \quad \text{Formula 3}$$

wherein $X_1$, $X_2$, and $X_3$ are independently a hydrogen atom, $C_1$ to $C_3$ alkyl group, $C_1$ to $C_{10}$ alkoxy group, or a halogen atom, wherein at least one of $X_1$, $X_2$, and $X_3$ is a hydrolyzable functional group; and M is a single bond, $C_1$ to $C_{10}$ alkylene group, or an arylene group having 6 to 15 carbon atoms;

$$(R_1)_nSi(OR_2)_{4-n} \quad \text{Formula 4}$$

wherein $R_1$ is a hydrogen atom, $C_1$ to $C_3$ alkyl group, a halogen group, or $C_6$ to $C_{15}$ aryl group, $R_2$ is a hydrogen atom, $C_1$ to $C_3$ alkyl group, or $C_6$ to $C_{15}$ aryl group, wherein at least one of $R_1$ and $OR_2$ is a hydrolyzable functional group; and n is an integer from 0 to 3; and Formula 5

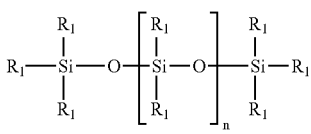

wherein $R_1$ is a hydrogen atom, $C_1$ to $C_3$ alkyl group, $C_1$ to $C_{10}$ alkoxy group, or a hydroxy or halogen atom, wherein at least one of said groups is a hydrolyzable functional group; and n is an integer from 0 to 30.

4. The composition as set forth in claim 1, wherein each of the siloxane monomers is one type of monomer selected from the group consisting of siloxane monomers represented by the following Formulas 6, 7, 8, 9, 10, 11, and 15:

Formula 6

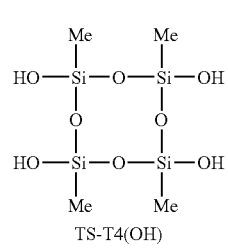

TS-T4(OH)

Formula 7

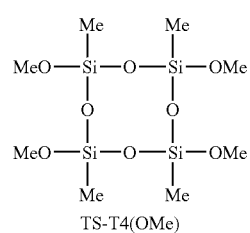

TS-T4(OMe)

Formula 8

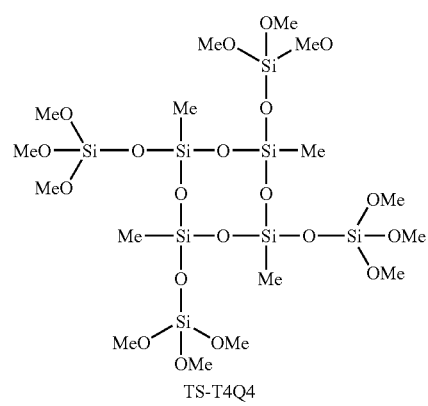

TS-T4Q4

Formula 9

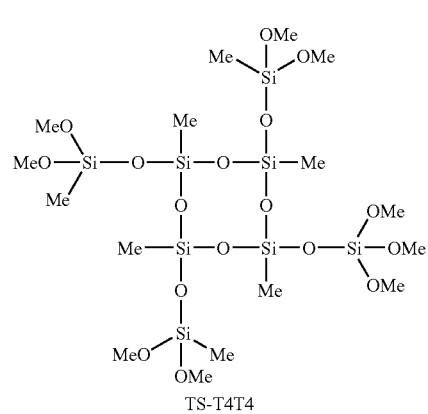

TS-T4T4

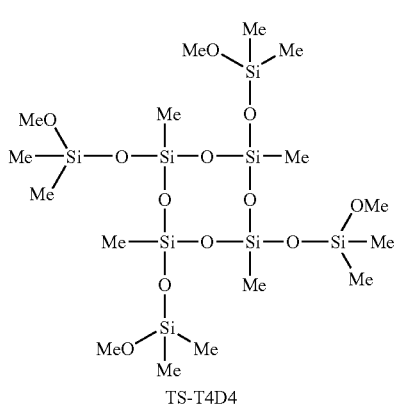

TS-T4D4

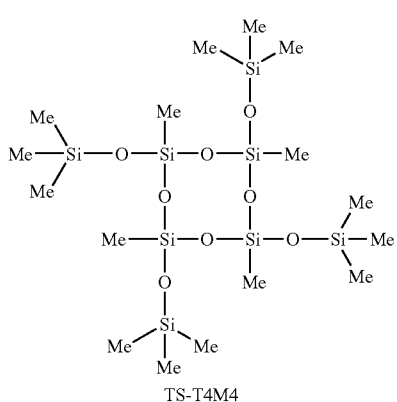

TS-T4M4

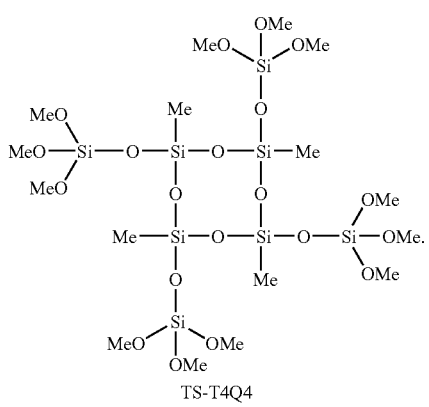

TS-T4Q4

5. The composition as set forth in claim 1, wherein the siloxane monomers including only one type of stereoisomer are cis-type siloxane monomers.

6. The composition as set forth in claim 1, wherein the siloxane monomers including only one type of stereoisomer are trans-type siloxane monomers.

7. The composition as set forth in claim 1, wherein the porogen is selected from the group consisting of polycaprolactone, α-cyclodextrin, β-cyclodextrin, and γ-cyclodextrin.

8. The composition as set forth in claim 1, wherein the porogen is a surfactant selected from the group consisting of sulfate, sulfonate, phosphate, carboxylic acid, an alkyl ammonium salt, a gemini surfactant, a cetyl ethyl piperidinium salt, dialkyl dimethyl ammonium, a BRij-based surfactant, primary amine, poly(oxyethylene) oxide, octaethylene glycol monodecyl ether, octaethylene glycol monohexadecyl ether, octylphenoxy polyethoxy(9-10) ethanol, and a polyethylene oxide-polypropylene oxide-polyethylene oxide block copolymer.

9. The composition as set forth in claim 1, wherein the solvent is selected from the group consisting of an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent, and a mixture thereof.

10. The composition as set forth in claim 1, wherein an acid catalyst is hydrochloric acid, nitric acid, benzene sulfonic acid, oxalic acid, or formic acid, and a base catalyst is potassium hydroxide, sodium hydroxide, triethylamine, sodium bicarbonate, or pyridine.

11. A composition for forming a low dielectric thin film, comprising:
    organosilicon monomers having only one type of stereoisomer;
    a solvent,
    an acid or a base; and
    water.

12. A composition for forming a low dielectric thin film, comprising:
    1-70 wt % siloxane polymer, which is produced by polymerizing siloxane monomers, comprising a monomer of a single type of stereoisomer;
    0-50 wt % porogen; and
    a solvent.

13. The composition as set forth in claim 12, wherein the siloxane polymer is produced by hydrolyzing and polycondensating one or more monomers which include only one type of stereoisomer selected from the group consisting of monomers represented by the following Formulas 1 to 5 in an organic solvent in the presence of an acid or base catalyst and water:

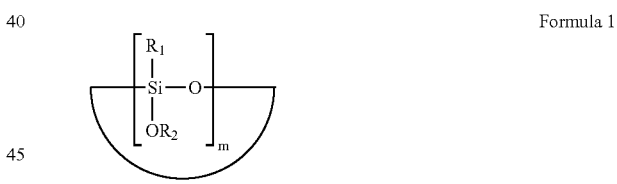

Formula 1 wherein $R_1$ is a hydrogen atom, $C_1$ to $C_3$ alkyl group, or $C_6$ to $C_{15}$ aryl group, $R_2$ is a hydrogen atom, $C_1$ to $C_{10}$ alkyl group, or $SiX_1X_2X_3$, wherein $X_1$, $X_2$, and $X_3$ are independently a hydrogen atom, $C_1$ to $C_3$ alkyl group, $C_1$ to $C_{10}$ alkoxy group, or a halogen atom, wherein at least one of functional groups, $R_1$ and $R_2$, is a hydrolyzable group; and m is an integer from 3 to 8;

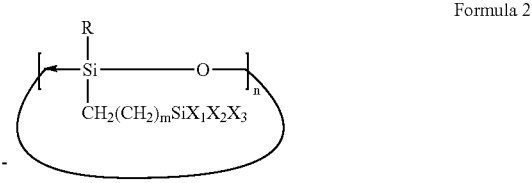

Formula 2 wherein R is a hydrogen atom, $C_1$ to $C_3$ alkyl group, $C_3$ to $C_{10}$ cycloalkyl group, or $C_6$ to $C_{15}$ aryl group, $X_1$, $X_2$, and $X_3$ are independently $C_1$ to $C_3$ alkyl group, $C_1$ to $C_{10}$ alkoxy group, or a halogen group, n is an integer from 3 to 8, and m is an integer from 1 to 10;

$$X_3X_2X_1Si-M-SiX_1X_2X_3 \qquad \text{Formula 3}$$

wherein $X_1$, $X_2$, and $X_3$ are independently a hydrogen atom, $C_1$ to $C_3$ alkyl group, $C_1$ to $C_{10}$ alkoxy group, or a halogen atom, wherein at least one of $X_1$, $X_2$, and $X_3$ is a hydrolyzable functional group; and M is a single bond, $C_1$ to $C_{10}$ alkylene group, or an arylene group having 6 to 15 carbon atoms;

$$(R_1)_n Si(OR_2)_{4-n} \qquad \text{Formula 4}$$

wherein $R_1$ is a hydrogen atom, $C_1$ to $C_3$ alkyl group, a halogen group, or $C_6$ to $C_{15}$ aryl group, $R_2$ is a hydrogen atom, $C_1$ to $C_3$ alkyl group, or $C_6$ to $C_{15}$ aryl group, wherein at least one of $R_1$ and $OR_2$ is a hydrolyzable functional group; and n is an integer from 0 to 3; and

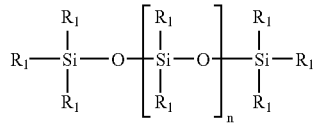

Formula 5 wherein $R_1$ is a hydrogen atom, $C_1$ to $C_3$ alkyl group, $C_1$ to $C_{10}$ alkoxy group, or a hydroxy or halogen atom, wherein at least one of said groups is a hydrolyzable functional group; and n is an integer from 0 to 30.

14. The composition as set forth in claim 12, wherein the siloxane polymer is produced by hydrolyzing and polycondensating one or more monomers which include only one type of stereoisomer selected from the group consisting of monomers represented by the following Formulas 6, 7, 8, 9, 10, 11, and 15 in an organic solvent in the presence of an acid or base catalyst and water:

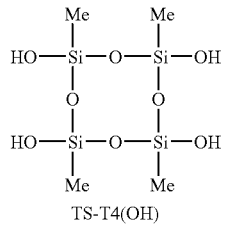

Formula 6

TS-T4(OH)

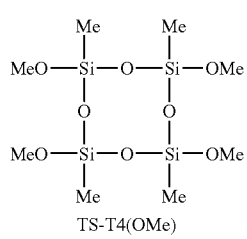

Formula 7

TS-T4(OMe)

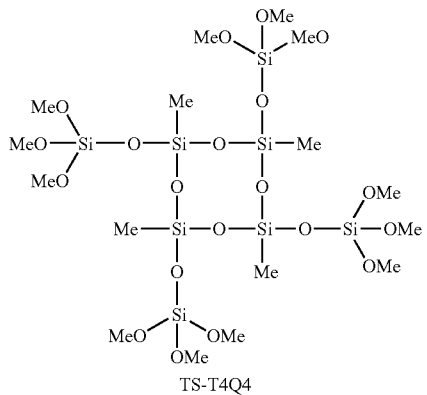

Formula 8

TS-T4Q4

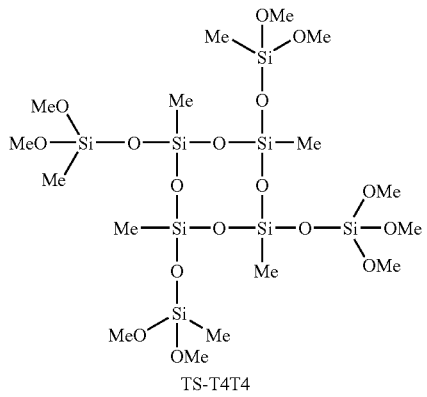

Formula 9

TS-T4T4

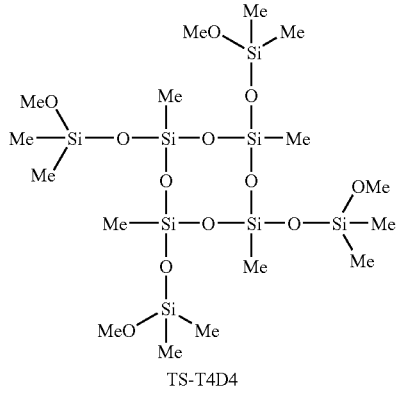

Formula 10

TS-T4D4

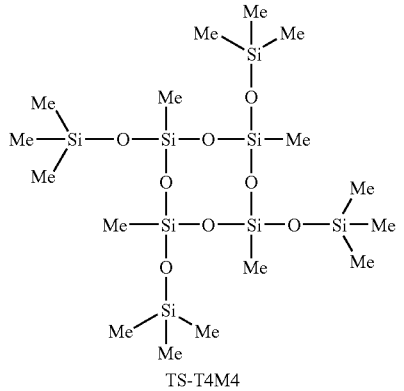

Formula 11

TS-T4M4

-continued

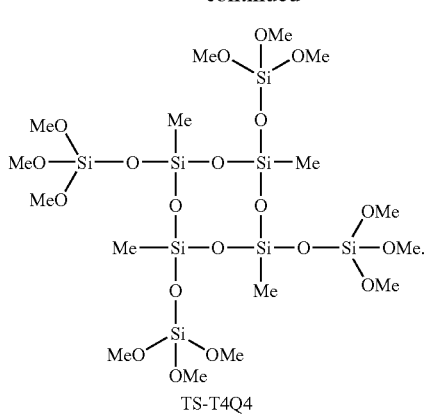

Formula 15

TS-T4Q4

15. The composition as set forth in claim 12, wherein the siloxane polymer is produced by polymerizing only cis-type siloxane monomers.

16. The composition as set forth in claim 12, wherein the siloxane polymer is produced by polymerizing only trans-type siloxane monomers.

17. The composition as set forth in claim 12, wherein the porogen is selected from the group consisting of polycaprolactone, α-cyclodextrin, β-cyclodextrin, and γ-cyclodextrin.

18. The composition as set forth in claim 12, wherein the porogen is a surfactant selected from the group consisting of sulfate, sulfonate, phosphate, carboxylic acid, an alkyl ammonium salt, a gemini surfactant, a cetyl ethyl piperidinium salt, dialkyl dimethyl ammonium, a BRij-based surfactant, primary amine, poly(oxyethylene) oxide, octaethylene glycol monodecyl ether, octaethylene glycol monohexadecyl ether, octylphenoxy polyethoxy(9-10) ethanol, and a polyethylene oxide-polypropylene oxide-polyethylene oxide block copolymer.

19. The composition as set forth in claim 12, wherein the solvent is selected from the group consisting of an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent, and a mixture thereof.

20. A method of producing a low dielectric thin film, comprising:
applying the composition according to claim 1 on a substrate; and
hardening the resulting composition.

21. A method of producing a low dielectric thin film, comprising:
applying the composition according to claim 12 on a substrate; and
hardening the resulting composition.

22. The method as set forth in claim 20, wherein the application is conducted using spin coating, dip coating, spray coating, flow coating, or screen printing.

23. The method as set forth in claim 21, wherein the application is conducted using spin coating, dip coating, spray coating, flow coating, or screen printing.

24. The method as set forth in claim 20, wherein the hardening is conducted by heating at 150-600° C. for 1-180 min.

25. The method as set forth in claim 21, wherein the hardening is conducted by heating at 150-600° C. for 1-180 min.

26. A semiconductor interlayer insulating film produced using the composition according to claim 1.

27. A semiconductor interlayer insulating film produced using the composition according to claim 12.

* * * * *